United States Patent [19]

Bauduin

[11] Patent Number: 5,473,641
[45] Date of Patent: Dec. 5, 1995

[54] FREQUENCY SLAVING APPARATUS

[75] Inventor: Jean-Pierre Bauduin, Combourg, France

[73] Assignees: France Telecom; Telediffusion de France, both of Paris, France

[21] Appl. No.: 310,310

[22] Filed: Sep. 22, 1994

[30] Foreign Application Priority Data

Sep. 28, 1993 [FR] France .................................. 93 11633

[51] Int. Cl.$^6$ ..................................................... H03D 3/24
[52] U.S. Cl. ............................................ 375/376; 331/25
[58] Field of Search ............................. 375/120; 331/25, 331/17, 1 R, 1 A

[56] References Cited

U.S. PATENT DOCUMENTS 4,743,857  5/1988  Childers .................................. 375/120

Primary Examiner—Stephen Chin
Assistant Examiner—Huong Luu
Attorney, Agent, or Firm—Laubscher & Laubscher

[57] ABSTRACT

A frequency control device comprises, in the form of a phase-locked loop, a phase comparator, a filter, an oscillator producing a local clock signal and two divide-by-M frequency dividers. The dividers receive the local clock signal whose frequency is slaved to N times the frequency of a master clock signal, with M<N, and are looped to the inputs of the comparator. A first of the dividers is reinitialized at the frequency of the master clock signal. A load circuit loads the most-significant-bit stages of a counter included in the first divider with a binary word added to binary elements stored in most-significant-bit stages of a counter included in the second divider, after a resetting of the second divider following a general initialization of the device.

3 Claims, 3 Drawing Sheets

FREQUENCY SLAVING APPARATUS

BACKGROUND OF THE INVENTION

1. Field of the Invention

The present invention is generally concerned with a device for slaving the frequency of a local clock signal to N times the frequency of a master clock signal where N is a predetermined integer.

2. Description of the Prior Art

Such a local clock signal frequency slaving device is typically used during a frequency maintaining phase following on from a frequency acquisition phase. The frequency of the local clock signal equal to N times the frequency of the master clock signal is acquired during the acquisition phase and this acquired frequency is maintained by the frequency slaving device.

The invention finds one application in the field of telecommunications for slaving the frequency of a sampling local clock signal in a receiving system to N times the frequency of a master clock signal received by the system. The frequency of the master clock signal is, for example, the frequency of data frames received by the receiving system. In this example, the local clock signal has a frequency equal to the frequency of the binary elements in each frame, N being then equal to the number of bits in a frame. A such application example of the invention can recover the frequency of the binary elements in each frame from the frame frequency in order to sample the binary elements and so recover the data included in the frames.

FIG. 1 is a block diagram of a prior art frequency slaving apparatus or device 1, also called as a frequency control device, with which the person skilled in the art is very familiar. The device 1 is a phase-locked loop comprising a phase comparator 10, a filter 11, a voltage controlled oscillator 12 and a divide-by-N frequency divider 13. The comparator 10, the filter 11 and the oscillator 12 are connected in cascade in that order. An output of the oscillator 12 is fed back to a first input $10_1$ of the phase comparator 10 through the frequency divider 13. A second input $10_2$ of the phase comparator 10 receives a master clock signal Sp at a master frequency fp.

The frequency slaving device shown in FIG. 1 operates as follows:

The phase comparator 10 compares the phase of the master clock signal Sp with the phase of a slaving clock signal Sa produced from the output of the frequency divider 13 and supplies a control voltage Vc to control the oscillator 12 via the filter 11. The slaving clock signal Sa has a frequency fa which is N times smaller than the frequency fl of the local clock signal S1 at the output of the oscillator 12 and substantially equal to the frequency fp of the master clock signal Sp.

The prior art device 1 is typically used when the frequency ratio fl/fp between the frequency fl of the local clock signal S1 and the frequency fp of the master clock signal Sp is less than a value substantially equal to $10^4$. It is to be noticed that if the frequency fp of the clock signal Sp is very low, i.e., if the period of the signal Sp is very high, the device 1 cannot be used because of manufacturing problems with the filter 11, as its components must have high values to filter the control signal Vc and also to ensure an accurate control of the oscillator 12.

If the frequency ratio fl/fp is greater than a value substantially equal to $10^4$ the device 1 cannot be used. An infinitesimal increase or decrease in the frequency fl of the signal S1 produced by the oscillator causes only a very small variation in the phase of the control clock signal Sa, given the ratio of the periods of the signals Sa and S1, with the result that the device is inaccurate.

In practice, when the frequency ratio fl/fp is high, typically greater than 104, the prior art technique uses two frequency slaving devices 1 and 2 of the type shown in FIG. 1 connected in cascade. In this implementation shown in block diagram form in FIG. 2, each of the first and second frequency slaving devices is a phase-locked loop comprising a phase comparator 10, 20, a filter 11, 21, a voltage controlled oscillator 12, 22 and a frequency divider 13P, 23 arranged in the same manner as in FIG. 1. The output of the oscillator 12 in the first slaving device 1 is applied to a second input $20_2$ 2 of the phase comparator 20 in the second slaving device 2. The two frequency slaving devices 1 and 2 connected in cascade yield a frequency multiplication factor equal to N=(P×M) corresponding to the multiplication of two frequency division ratios P and M in the frequency dividers 13P and 23. The second oscillator 22 produces a local clock signal S1 having a frequency N=(P×M) times greater than the frequency fp of the master clock signal Sp applied to the second input $10_2$ of the phase comparator 10.

This implementation solves the problem previously stated relating to an excessively high multiplication ratio between the frequency fp of a master clock signal Sp received and the frequency fl of a local clock signal S1 to be generated.

However, both prior art implementations have the following drawbacks.

For applications in which the frequency ratio between the frequency fl of the local clock signal S1 and the frequency fp of the master clock signal fp is very high, typically greater than $10^4$, the device 1 cannot be used. The FIG. 2 implementation doubles the number of electronic components as two phase locked loops are used and thus increases the cost.

OBJECTS OF THE INVENTION

The main object of this invention is to remedy the aforementioned drawbacks.

Another object of this invention is to provide a frequency slaving device for applications in which the frequency ratio between the local clock signal frequency and the master clock signal frequency is high and which is of lower cost than the prior art implementation shown in FIG. 2.

SUMMARY OF THE INVENTION

The invention consists in a device for slaving a local frequency of a local clock signal to N times a master frequency of a master clock signal where N is a predetermined integer. The device comprises, in the form of a phase-locked loop, phase comparator means having first and second inputs thereby producing a control signal, filter means for filtering the control signal into a filtered control signal, oscillator means controlled by the filtered control signal thereby producing the local clock signal, and first divide-by-M frequency divider means receiving the local clock signal, where M is a predetermined integer less than N, for dividing the local frequency into an intermediate frequency of a first slaving signal applied to the first input of the phase comparator means. The device further comprises second divide-by-M frequency divider means receiving the local clock signal and periodically reset at the master frequency by the master clock signal for dividing the local frequency into the intermediate frequency in a second slaving signal applied to the second input of the phase comparator means. The phase comparator means compare respective phases of the first and second slaving signals thereby producing the control signal.

The periodic resetting of the second frequency divider means imposes a phase reference on the second slaving signal dependent on the frequency of the master clock signal, and so enables the local clock signal frequency to be slaved to the master clock signal.

According to a preferred embodiment, the first and second frequency divider means each include a modulo-M counter incremented by the local clock signal.

According to another aspect of the invention, the device comprises adding means connected between the first and second frequency divider means so as to quickly stabilize the local clock signal in response to powering up of the device or after an interruption of the master clock signal. The adding means may be means for adding a predetermined binary word to binary elements respectively stored in most-significant-bit stages of the counter included in the second frequency divider means into a binary result thereby loading most-significant-bit stages of the counter included in the first frequency divider means with the binary result, in response to a general initialization of the device and periodically at the master frequency of the master clock signal.

BRIEF DESCRIPTION OF THE DRAWINGS

The foregoing and other objects, features and advantages of the invention will be apparent from the following detailed description of several embodiments of the invention with reference to the corresponding accompanying drawings in which.

DESCRIPTION OF THE PREFERRED EMBODIMENTS

Figure 3:
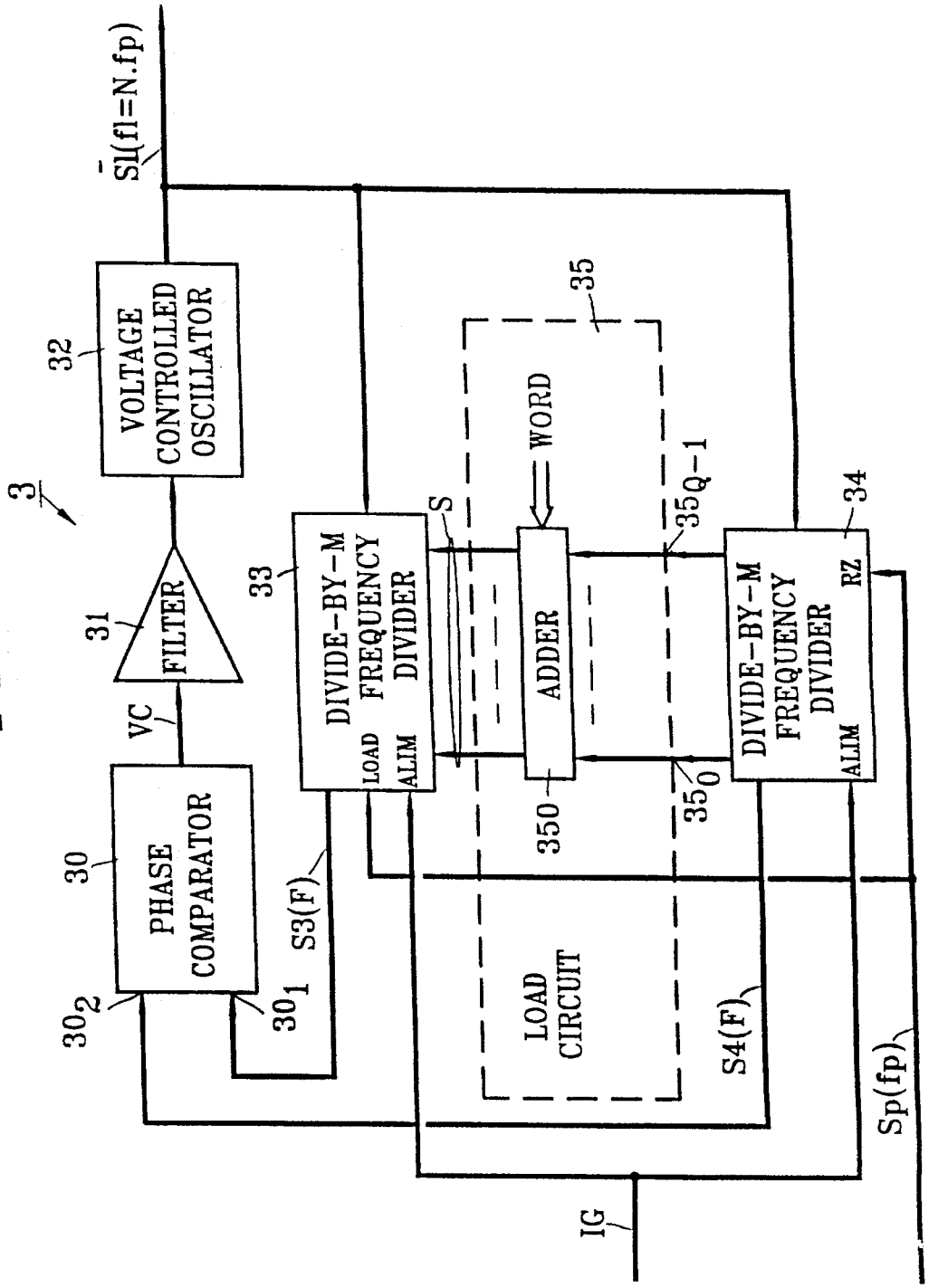
FIG. 3 is a block diagram of a frequency slaving device according to the invention.

Referring to FIG. 3, a frequency slaving device 3 of the invention for slaving the frequency fl of a local clock signal S1 to N times the frequency fp of a master clock signal Sp comprises a phase comparator 30, a filter 31, a voltage controlled oscillator 32, first and second divide-by-M frequency dividers 33 and 34, where M is a predetermined integer less than N, and a load circuit 35. The frequencies fp and fl are 40.96 Hz and 12,288 MHz, respectively, the integer N is 300,000, and the integer M is 4 096, for example.

The phase comparator 30, the filter 31 and the oscillator 32 are cascaded in that order. An output of the oscillator 32 is connected to respective inputs of the frequency dividers 33 and 34. Each of the dividers 33 and 34 includes a modulo-M counter which is preferably programmable. Outputs of the dividers 33 and 34 are fed back to first and second inputs $30_1$ and $30_2$ of the phase comparator 30. The second frequency divider 34 receives at a resetting input RZ the master clock signal Sp, "resetting" of the divider 34 corresponding to a resetting to zero (RZ) of the counter counting pulses of the signal fl and included in the divider 34. The load circuit 35 has Q parallel inputs $35_0$ through $35_{Q-1}$ respectively connected to Q most-significant-bit stages of the counter included in the frequency divider 34, and Q parallel outputs respectively supplied to Q most-significant-bit stages of the counter included in the frequency divider 33.

The frequency slaving device 3 of the invention operates as follows.

The function of the two frequency dividers 33 and 34 is to derive respective slaving control clock signals S3 and S4 at an intermediate frequency F which is less than and a submultiple of the frequency fl of the local clock signal S1 to be generated but greater than and a multiple of the frequency fp of the master clock signal Sp. The frequency divider 34 dividing by M is reset at the master frequency fp by rising edges of the master clock Sp. Because of this periodic resetting, a phase reference of the slaving clock signal S4 is timely maintained upon dependence of the signal Sp, which authorizes frequency slaving. If there were no such resetting, a slip of the meaningful phase times of the signals S3 and S4 relative to the resetting signal Sp would produce on dependence of the permanent frequency slip of the local clock signal S1 produced by the oscillator 32 about the frequency (N×fp), and frequency slaving could not be achieved. It is to be noticed that the intermediate frequency F of the slaving control signals S3 and S4 must be a multiple of the master frequency fp, to within a variation of the frequency of the signal S1 produced by the oscillator 32 about the maintaining frequency (N×fp) to avoid periodic phase jumps in the signal S4 at the frequency of the master clock signal Sp relative to the signal S3 because of the periodic resetting of the divider 34 by the signal Sp.

The phase comparator 30 compares the phase of the signal S3 to the phase of the signal S4 which is constant on time average because of the periodic resetting of the divider 34 by the signal Sp. The phase comparator 30 produces a control voltage VC controlling the oscillator 32 via the filter 31. The oscillator 32 produces the local clock signal S1 so that the slaving clock signal S3 is slaved to the phase of the signal S4. This phase slaving ensures that, on the one hand, the local frequency fl is equal to N times the master frequency fp and, on the other hand, the phase of the local clock signal S1 coincides periodically, at the local frequency fp, with the phase of the master signal Sp, apart from a phase-shift.

The operation of the embodiment as described above without the load circuit 35 ignores the fact that after general initialization IG of the slaving device 3, i.e. after powering up of the frequency slaving device 3, the phase of a first rising edge of the slaving signal S4, being dependent on the time at which the frequency divider 34 is reset by the master clock signal Sp, can be very different (phase difference substantially equal to 0 or π for a phase comparator in the form of an exclusive-OR gate) from the phase of a first rising edge of the control signal S3 dependent on the time of the general initialization of the device. This yields a relatively long convergence time for slaving the local frequency fl to N times the master frequency fp, due to oscillations of the frequency of the signal S1 about the frequency (N×fp).

The loading circuit 35 is designed to remedy this drawback. The circuit 35 comprises an adder 350. The outputs of the most-significant-bit stages of the counter included in the divider 34 are applied to respective first parallel inputs of the adder 350. Second parallel inputs of the adder 350 receive a predetermined binary word WORD from a wired read-only memory. Q parallel outputs S of the adder 350 are applied respectively to Q most-significant-bit stages of the counter included in the divider 33.

The dividers 33 and 34 are initialized in response to powering up of the device 3 by the general initialization signal IG. The binary elements stored in the Q most-significant-bit stages of the counter included in the divider 34 are applied to the first inputs of the adder 350. The adder 350 adds these binary elements to the predetermined word WORD and the binary result of this addition is loaded into the Q most-significant-bit stages of the counter included in the divider 33.

General initialization IG of the slaving device 3 is followed by loading of the stored binary elements into the Q most-significant-bit stages of the counter included in the divider 34, to which the word WORD is added, into the Q most-significant-bit stages of the counter included in the divider 33. The purpose of this loading is to produce a phase-shift between the slaving signals S3 and S4. This phase-shift is equal to the ratio of the difference of the respective binary values stored in the most-significant-bit stages in the two counters of the dividers 33 and 34, to the number of counting states of the two counters included in the dividers 33 and 34, multiplied by the period 1/F of the control signals S3 and S4, thereby controlling the oscillator 32 within its frequency acquisition range, preventing oscillation of the frequency fl produced by the oscillator 32 about the frequency (N×fp). The frequency acquisition range of the oscillator 32 in terms of phase is defined by a periodic phase-shift between the signals S3 and S4 less than a predetermined threshold about a given phase-shift between these two signals corresponding to maintaining of the current frequency. This given phase-shift depends on the type of phase comparator used. For a comparator in the form of an exclusive-OR gate, for example, this acquisition range corresponds to a phase-shift between the signals S3 and S4 about ($\pi/2$). The word WORD is therefore dependent on the phase-shift between the signals S3 and S4 for which the oscillator 32 is controlled to maintain the current frequency. It depends on the type of phase comparator used.

Following this general initialization of the device 3, each rising edge of the master clock signal Sp which is applied to the reset input RZ of the counter included in the divider 34 and to a loading input LOAD of the counter included in the divider 33, guarantees resetting to zero of the counter included in the divider 34 and loading of the most-significant-bit stages of the counter included in the divider 33 with the word WORD added to the binary elements stored in the most-significant-bit stages of the divider 34. In normal operation this resetting to zero and loading of the counters included in the dividers 34 and 33 confirm the binary values stored in these counters. On the other hand, momentary interruption of reception of the master clock signal Sp leading to incrementing at a variable frequency of the counters 34 and 33 dependent on the variation of the frequency fl about the maintaining frequency (N×fp) is corrected by a rising edge of the master signal Sp following on from this momentary interruption of reception of the master signal by resetting and loading of the counters 34 and 33.

Figure 1:
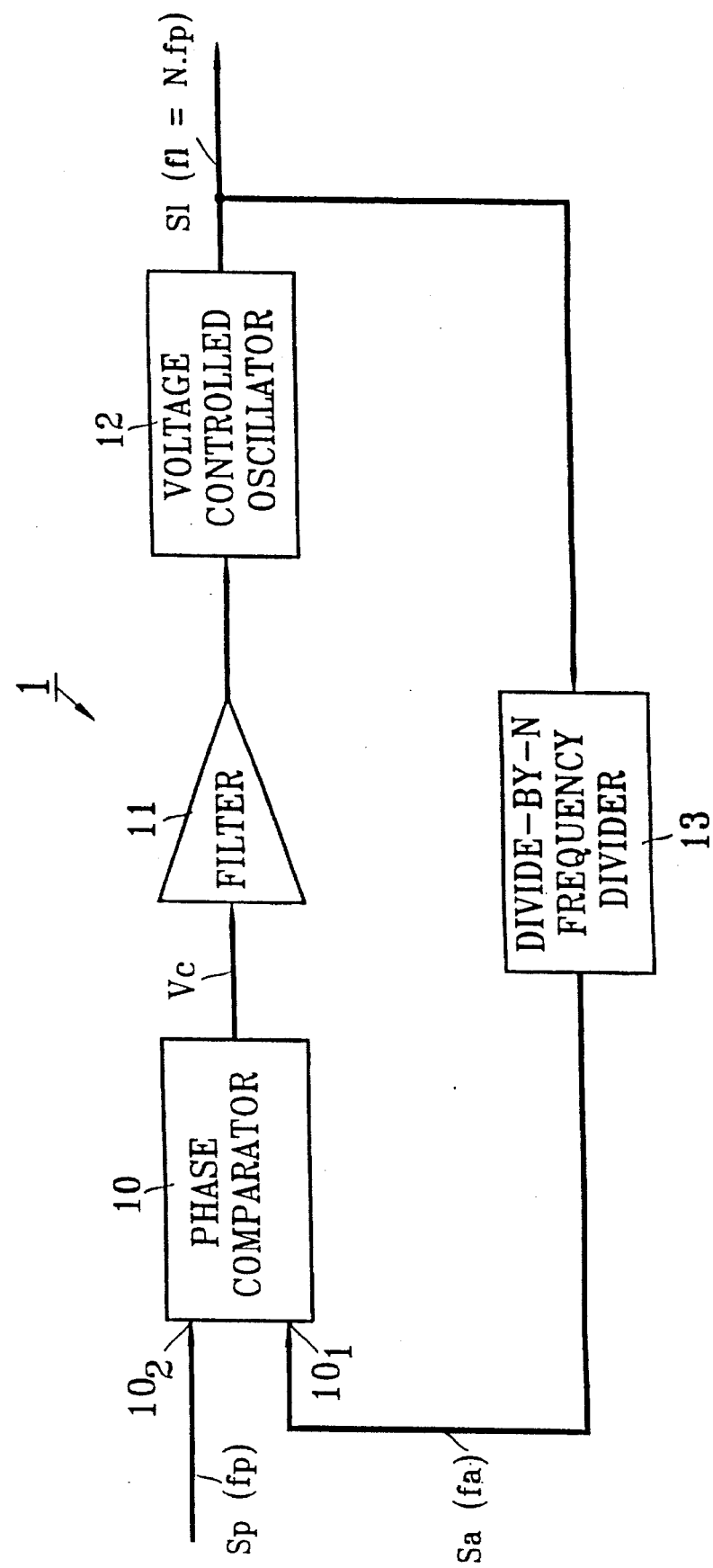
FIG. 1, already commented on, is a block diagram of a prior art frequency slaving device.
Figure 2:
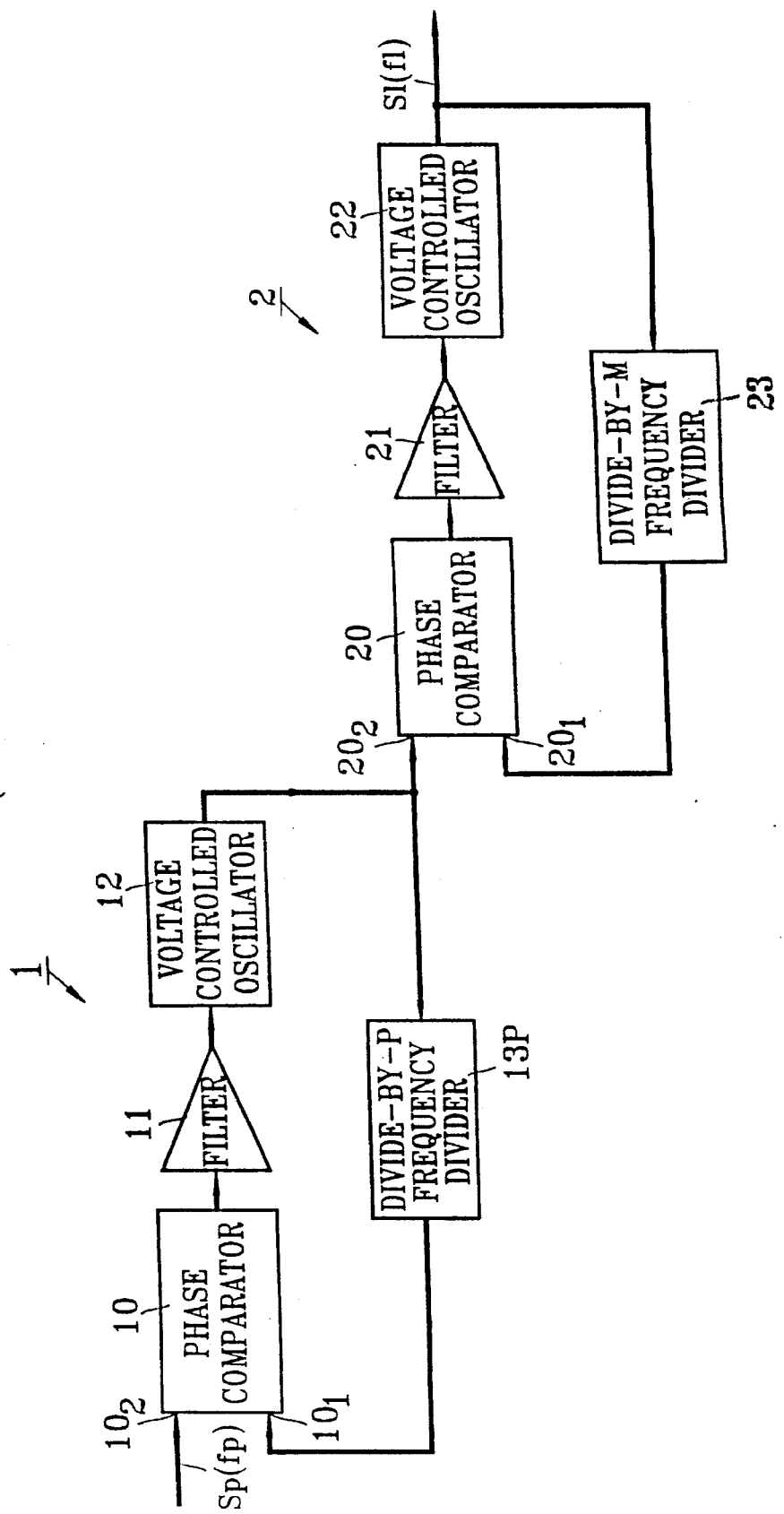
FIG. 2, also already commented on, is a block diagram of a prior art frequency slaving device cascading two frequency slaving devices of the type shown in FIG. 1.

The person skilled in the art will understand that, unlike the FIG. 2 device, the slaving device 3 of the present invention is not affected by momentary interruption of reception of the master clock signal Sp. The two slaving control signals S3 and S4 continue to be produced by the two dividers 33 and 34, and the only effect is a drift in the frequency of the local clock signal S1 because of the momentary loss of the phase of the signal Sp due to the momentary interruption of reception. In the case of the FIG. 2 device, momentary interruption of reception of the master clock signal leads to a long period during which the frequency fl is not maintained at N times the frequency fp.

What I claim is:

1. Apparatus for slaving the local frequency of a local clock signal to N times the master frequency of a master clock signal, comprising:

(a) phase comparator means having a first input, a second input, and an output at which a control voltage is produced;

(b) filter means for filtering said control voltage to produce a filtered control voltage;

(c) voltage controlled oscillator means having an output at which a local clock signal responsive to said filtered control voltage is produced;

(d) first frequency divider means and second frequency divider means each including modulo-M counter means having most-significant-bit stages, respectively, where M is a predetermined integer less than N, said first frequency divider means and said second frequency divider means having outputs for supplying first and second slaving control signals to the first input and second input of said phase comparator means, respectively, said first frequency divider means and said second frequency divider means having first inputs connected with the output of said voltage controlled oscillator means, thereby to increment the counters of said first frequency divider means and said second frequency divider means with said local clock signal;

(e) adder means connected between said most-significant-bit stages of the counters in said first frequency divider means and second frequency divider means for adding a predetermined binary word to binary elements stored in the most-significant-bit stages of the counter of said second frequency divider means, thereby to derive a binary addition result;

(f) means for supplying a general initializing signal to the counters of said first frequency divider means and said second frequency divider means, thereby to initially load the result of the binary addition into the most-significant-bit stages of the counter of said first frequency divider means; and (g) means for supplying said master clock signal to said first frequency divider means and said second frequency divider means to periodically reset to zero the counter of said second frequency divider means and to periodically load the most-significant-bit stages of the counter of said first frequency divider means with the binary addition result.

2. Apparatus as defined in claim 1, wherein said first and second slaving control signals each have an intermediate frequency which is less than and a submultiple of said local clock frequency of the local clock signal, and which is greater than and a multiple of said master clock frequency.

3. Apparatus as defined in claim 2, wherein said addition result is loaded from said adder means into the most-significant-bit stage of the counter of said first frequency divider means, thereby to produce a phase shift between the first and second slaving control signals equal to the ratio of the difference of the respective binary values stored in the most-significant-bit stages in the counters of said first and second frequency divider means to the number of counting states of the counters multiplied by the period 1/F of the first and second slaving control signals.

* * * * *